US010825954B2

(12) United States Patent
Morelli et al.

(10) Patent No.: US 10,825,954 B2
(45) Date of Patent: Nov. 3, 2020

(54) POROUS-SILICON LIGHT-EMITTING DEVICE AND MANUFACTURING METHOD THEREOF

(71) Applicant: STMicroelectronics S.r.l., Agrate Brianza (IT)

(72) Inventors: Marco Morelli, Bareggio (IT); Fabrizio Fausto Renzo Toia, Busto Arsizio (IT); Giuseppe Barillaro, Pisa (IT); Marco Sambi, Cornaredo (IT)

(73) Assignee: STMICROELECTRONICS S.R.L., Agrate Bianza (IT)

( * ) Notice: Subject to any disclaimer, the term of this patent is extended or adjusted under 35 U.S.C. 154(b) by 151 days.

(21) Appl. No.: 15/983,959

(22) Filed: May 18, 2018

(65) Prior Publication Data

US 2018/0269357 A1    Sep. 20, 2018

Related U.S. Application Data

(62) Division of application No. 15/087,183, filed on Mar. 31, 2016, now Pat. No. 10,002,990.

(30) Foreign Application Priority Data

Jul. 17, 2015 (IT) .................. 102015000035609

(51) Int. Cl.
*H01L 33/14* (2010.01)
*H01L 33/34* (2010.01)
*H01L 33/00* (2010.01)

(52) U.S. Cl.
CPC ........ *H01L 33/346* (2013.01); *H01L 33/0054* (2013.01); *H01L 33/145* (2013.01)

(58) Field of Classification Search
CPC .. H01L 33/0054; H01L 33/145; H01L 33/346
See application file for complete search history.

(56) References Cited

U.S. PATENT DOCUMENTS 5,077,143 A     12/1991  Barraclough et al.
5,272,355 A  *  12/1993  Namavar ............. H01L 33/346
                                                 257/103
(Continued)

FOREIGN PATENT DOCUMENTS

CN     205752219 U         11/2016
EP     3 118 905      *    1/2017  ............. H01L 33/14
(Continued)

OTHER PUBLICATIONS

Negishi et al., High Efficiency Electron-Emission in Pt/SiOx/Si/Al Structure, Jpn. J. Appl. Phys., vol. 36 (1997), pp. L939-L941. Part 2, No. 7B, Jul. 15, 1997. (Year: 1997).*

(Continued)

*Primary Examiner* — Mary A Wilczewski
(74) *Attorney, Agent, or Firm* — Slater Matsil, LLP

(57) ABSTRACT

A light-emitting device may include a semiconductor body having a first conductivity type, with a front side and a back side. The light-emitting device may also include a porous-silicon region which extends in the semiconductor body at the front side, and a cathode region in direct lateral contact with the porous-silicon region. The light-emitting device may further include a barrier region of electrically insulating material, which extends in direct contact with the cathode region at the bottom side of the cathode region so that, in use, an electric current flows in the semiconductor body through lateral portions of the cathode region.

28 Claims, 7 Drawing Sheets

(56) References Cited

U.S. PATENT DOCUMENTS

| | | | | |
|---|---|---|---|---|
| 5,285,078 | A | * | 2/1994 | Mimura ............... H01L 31/153 257/103 |
| 5,324,965 | A | * | 6/1994 | Tompsett ............. H01L 33/346 257/103 |
| 5,331,180 | A | * | 7/1994 | Yamada ................. B82Y 10/00 257/10 |
| 5,458,735 | A | * | 10/1995 | Richter .................. H01L 33/42 438/22 |
| 5,458,756 | A | * | 10/1995 | Bassous ............... H01L 21/306 204/224 M |
| 5,466,948 | A | * | 11/1995 | Worley ................. H01L 31/173 257/3 |
| 5,629,534 | A | | 5/1997 | Inuzuka et al. |
| 5,644,156 | A | * | 7/1997 | Suzuki ................... H01L 29/16 257/3 |
| 5,726,464 | A | * | 3/1998 | Kumomi .............. H01L 33/346 257/101 |
| 5,970,361 | A | * | 10/1999 | Kumomi ................ G01N 27/12 438/409 |
| 6,017,773 | A | * | 1/2000 | Fauchet ............... H01L 33/346 257/103 |
| 6,225,647 | B1 | * | 5/2001 | Kurtz .................... H01L 33/346 257/103 |
| 10,002,990 | B2 | * | 6/2018 | Morelli ................ H01L 33/145 |
| 2001/0017515 | A1 | * | 8/2001 | Kusunoki ............... H01J 1/312 313/496 |
| 2005/0042743 | A1 | * | 2/2005 | Kawai ................... C09K 11/77 435/287.2 |
| 2005/0092743 | A1 | * | 5/2005 | Lee ........................ H05B 6/642 219/746 |
| 2007/0217289 | A1 | * | 9/2007 | Watabe ................ H04R 23/002 367/189 |
| 2017/0018683 | A1 | | 1/2017 | Morelli et al. |
| 2017/0104187 | A1 | | 4/2017 | Scire et al. |
| 2018/0269357 | A1 | * | 9/2018 | Morelli ............... H01L 33/0054 |

FOREIGN PATENT DOCUMENTS

| | | | |
|---|---|---|---|
| EP | 3118905 A1 | 1/2017 | |
| JP | H0537013 A | 2/1993 | |
| JP | H0555627 A | 3/1993 | |
| WO | WO 95/17017 | * 6/1995 | ............ H01L 33/00 |

OTHER PUBLICATIONS

G. Barillaro, A. Diligenti, M. Piotto, M. Allegrini, F. Fuso, L. Pardi "Non-constant anodization current effects on spectra of porous silicon LEDs".

G. Barillaro et al., "Integrated porous-silicon light-emitting diodes: A fabrication process using graded doping profiles", Applied Physics Letters, vol. 78 n. 26, Jun. 25, 2001.

Kurt W. Kulasinski, "Porous Silicon Formation by Stain Etching", Springer International Publishing, Switzerland 2014, L. Canham (ed.), Handbook of Porous Silicon (PS by stain-etching).

Li Xiuling; "Metal assisted chemical etching for high aspect ratio nanostructures: A review of characteristics and applications in photovoltaics"; Solid State and Materials Science 16 (2012) 71-81.

M. Thakur, S.L. Sinsabaugh, M.J. Isaacson, M.S. Wong, S.L. Biswal, "Inexpensive method for producting macroporous silicon particulates (MPSPs) with pyrolyzed polycrylonitrile for lithium ion batteries", Scientific Reports, 2, 795 (2012).

P.J. French, P.T.Gennissen, P.M. Sarro, "Epi-micromachining", Microelectronics Journal 28 (1997), p. 459.

S.B. Jo, M.W. Lee, S.G. Lee, E.H. Lee, S.G. Park, B.H. O, Optics and Photonics Elite Research Academy (OPERA) School of Information & Communication Engineering, INHA University, 253 YongHyun-Dong, Namg-Gu, Incheon, 402-751, South Korea, Received Oct. 18, 2004; accepted May 2, 2005; published Jun. 27, 2005.

* cited by examiner

POROUS-SILICON LIGHT-EMITTING DEVICE AND MANUFACTURING METHOD THEREOF

CROSS-REFERENCE TO RELATED APPLICATIONS

This is a divisional application of U.S. application Ser. No. 15/087,183, filed on Mar. 31, 2016, which claims the benefit of Italy Application No. 102015000035609, filed on Jul. 17, 2015, which applications are hereby incorporated herein by reference.

TECHNICAL FIELD

The present invention relates to a light-emitting device based on porous silicon and to a manufacturing method thereof.

BACKGROUND

As is known, light-emitting devices, such as light emitting diodes (LEDs), based upon porous silicon are of great interest on account of their possible integration in semiconductor circuits manufactured with standard processes of a complementary metal oxide semiconductor (CMOS) type. However, the luminous efficacy of LED devices based upon porous silicon may be poor.

LED devices of a known type, for example, described by G. Barillaro et al., in "Integrated porous-silicon light-emitting diodes: A fabrication process using graded doping profiles", Applied Physics Letters, Vol. 78, No. 26, Jun. 25, 2001, include a substrate of a P-type housing a porous-silicon region, which extends from the top face of the substrate for a depth of some microns.

Extending into the porous-silicon region are one or more cathode contacts of an N+ type, which have a depth less than the maximum depth reached by the porous-silicon region.

During use, by applying a difference of potential between the N+ contacts and the back of the substrate, a current flows through the porous-silicon region, generating emission of photons, in a per se known manner. However, the portions of the porous-silicon region that extend underneath the N+ contacts do not take part in the emission of photons towards the outside of the device on account of the masking caused by the N+ contacts.

Other embodiments describe formation of porous silicon only at the sides of the N+ contacts and not also underneath them. However, in this case, the current flows mostly at the interface between the N+ contacts and the substrate, which has an electrical resistance lower than the resistance of the interface between the N+ contacts and the porous silicon. Thus, in either case the luminous efficacy of the LED device may not be satisfactory. This effect may give rise to an unsatisfactory luminous efficacy.

SUMMARY

The embodiments thus may provide a light-emitting device based upon porous silicon and a manufacturing method thereof that will address the disadvantages of the known approaches. According to an embodiment, a light-emitting device based upon porous silicon, and a manufacturing method thereof are provided.

In particular, a light-emitting device may include a semiconductor body having a first conductivity type, with a front side and a back side. The light-emitting device may also include a porous-silicon region, extending in the semiconductor body at the front side, and a cathode region, having a second conductivity type, having a top side facing the front side, a bottom side opposite to the top side, and lateral portions that extend between the top side and the bottom side, wherein the lateral portions of the cathode region are in direct electrical contact with the porous-silicon region. A barrier region of electrically insulating material, may extend in direct contact with the cathode region at the bottom side so that, in use, an electric current flows in the semiconductor body exclusively through the lateral portions of the cathode region.

The barrier region may be a monolayer of a material chosen from among silicon oxide, silicon nitride, alumina, high dielectric constant, or "high-k", materials, and low dielectric constant, or "low-k", materials, for example. The barrier region may be a multilayer region that includes two or more layers arranged on top of one another of materials chosen from among silicon oxide, silicon nitride, alumina, high dielectric constant, or "high-k", materials, and low dielectric constant, or "low-k", materials.

The barrier region may have a thickness between 10 nm and 700 nm, for example. The semiconductor body may have the first conductivity and a doping concentration between $10^{14}$ atoms/cm$^3$ and $10^{20}$ atoms/cm$^3$, and the cathode region may have the second conductivity and a doping concentration between $10^{16}$ and $10^{20}$ atoms/cm$^3$.

The semiconductor body may include a bulk region facing the back side and may have the first conductivity, a first doping value, and may form an anode region of the light-emitting device. The semiconductor body may also include a P-well region arranged between the bulk region and the front side, which has the first conductivity and a second doping value different from the first doping value of the bulk region. The porous-silicon region and the cathode region may extend completely in the P-well region, for example. The light-emitting device may also include a cathode contact metallization, which extends in electrical contact with the cathode region, and an anode contact metallization which extends in electrical contact with the bulk region.

A related method is directed to a method for manufacturing a light-emitting device. The method may include forming, in a semiconductor body having a front side and a back side, a cathode region, wherein the semiconductor body has a first conductivity type and the cathode region has a second conductivity type. The method may also include forming a porous-silicon region in direct contact with lateral portions of the cathode region. The lateral portions may be defined as the portions of the cathode region that extend between a top side, directly facing the front side, and a bottom side, opposite to the top side, of the cathode region. The method may also include forming a barrier region of electrically insulating material in direct contact with the cathode region on its bottom side.

DETAILED DESCRIPTION OF ILLUSTRATIVE EMBODIMENTS

Figure 1:
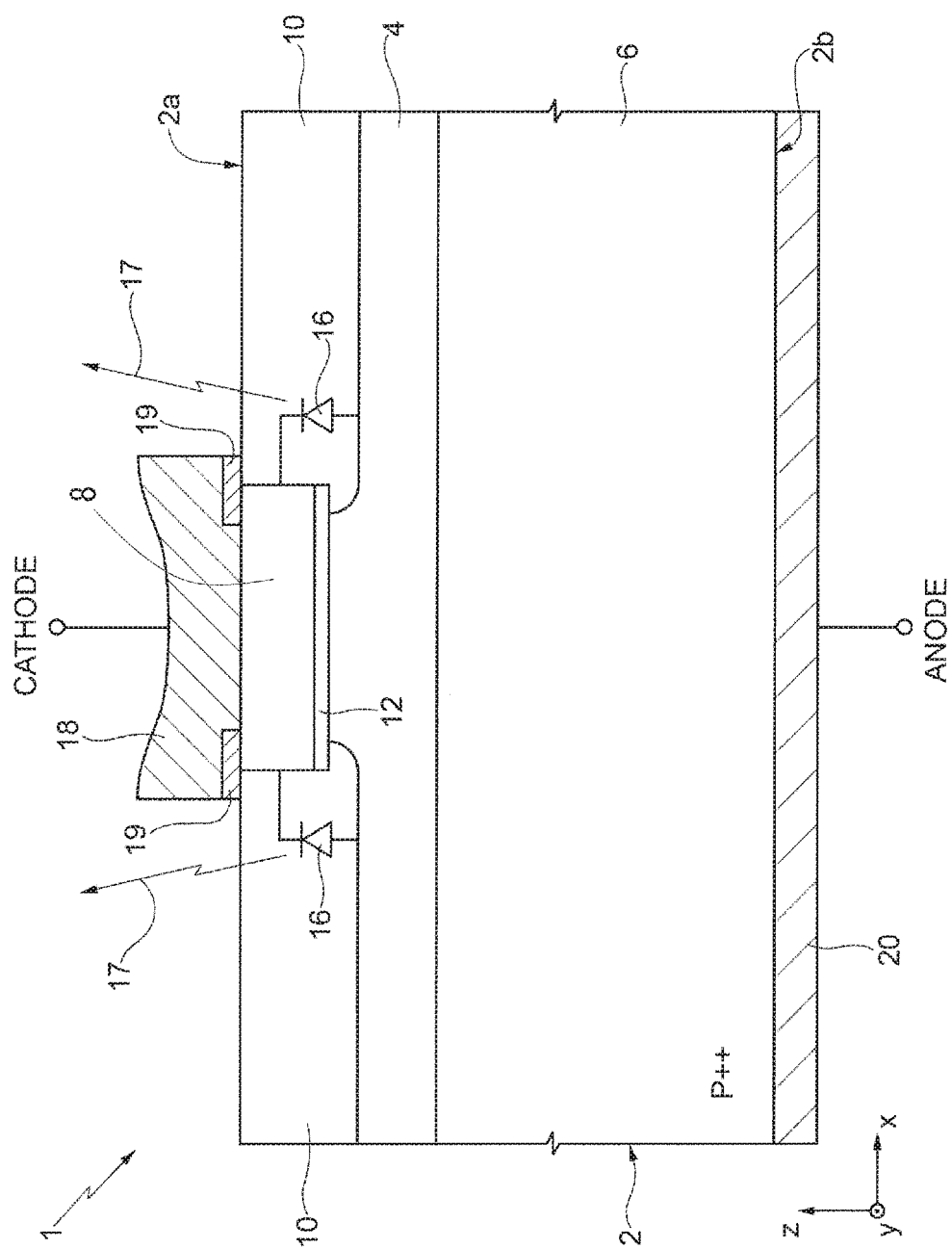
FIG. 1 is a lateral cross-sectional view of a portion of a light-emitting device according to an embodiment.

FIG. 1 shows, in lateral section, a portion 1 of a light-emitting device. In particular, a light-emitting device according to the present embodiments may comprise any plurality of portions 1, formed alongside one another, or else a single portion 1, surrounded by possible edge regions of the light-emitting device (not illustrated in detail in so far as it does not form the subject of the present disclosure). In what follows, the reference number 1 indifferently designates the portion 1 of the light-emitting device or the light-emitting device as a whole, without this implying any loss of generality.

The view of FIG. 1 is taken along a plane XZ of a Cartesian system with three mutually orthogonal axes X, Y, Z, and does not show possible edge regions of the light-emitting device 1. With reference to FIG. 1, according to one embodiment, the light-emitting device 1 comprises a substrate 2 of semiconductor material with a doping of a P type, which extends between a top surface 2a and a bottom surface 2b, with a total thickness between 400 and 1000 µm, typically 700 µm. The substrate 2 is made of monocrystalline silicon and may include one or more regions grown epitaxially.

The substrate 2 includes: (i) a P-well region 4, having a concentration of dopants of a p type (e.g., boron) between $10^{14}$ and $10^{17}$ atoms/cm$^3$, typically $10^{15}$ atoms/cm$^3$, which defines the top surface 2a and extends into the substrate 2 for a depth, measured from the top surface 2a, between 0.5 µm and 10 µm, typically 5 µm, and (ii) a bulk region 6, which extends between the P-well region 4 and the bottom surface 2b, having a concentration of dopants (e.g., boron) between $10^{18}$ atoms/cm$^3$ and $10^{20}$ atoms/cm$^3$, typically 1019 atoms/cm$^3$.

The P-well region 4 houses a cathode region 8, having doping of an N type, and a concentration of dopant atoms between $10^{16}$ and $10^{20}$ atoms/cm$^3$ (doping of an N+ type). A porous-silicon region 10 (in what follows, porous region 10) laterally surrounds the cathode region 8 in such a way that the cathode region 8 and the porous region 10 are in direct contact with one another. In particular, the cathode region 8 and the porous region 10 are completely in contact with one another on lateral portions of the cathode region 8.

The lateral portions of the cathode region 8 are defined as the portions of the cathode region 8 that extend between a top side and a bottom side of the cathode region 8 itself. In the embodiment of FIG. 1, the top side of the cathode region 8 extends in the same plane as that of the top surface 2a of the substrate 2, and the bottom side of the cathode region 8 extends in depth into the P-well region 4 in a plane of lie thereof parallel to the plane of lie of the top side. The lateral portions of the cathode region 8 may have a profile of any type, for example, they may extend substantially parallel to the axis Z (i.e., defining respective planes parallel to the planes XZ and YZ), or else have (in cross-sectional view) a curved or irregular shape, according to the manufacturing method used for the cathode region 8.

In top plan view (not illustrated), the cathode region 8 may have a shape chosen according to the need, for example the shape of an elongated strip, a quadrangular shape, or a generally curvilinear shape. As illustrated in FIG. 1, the porous region 10 may extend, at least in part, also underneath the cathode region 8, and not only laterally with respect thereto.

Extending underneath the cathode region 8 (in particular, between the cathode region 8 and the P-well region 4 and between the cathode region 8 and portions of the porous-silicon region that extend underneath the cathode region 8) is a barrier layer 12, in particular of electrically insulating material, such as silicon oxide, nitride oxide, alumina ($Al_2O_3$) or in general so-called "high-k" materials, i.e., with high dielectric constant (tantalum oxides $Ta_2O_5$, titanium oxides $TiO_2$, $SrTiO_3$, oxynitrides $SiO_xN_y$, etc.), and so-called "low-k" materials, i.e., with low dielectric constant (porous silicon oxide, C-doped or F-doped silicon oxide, etc.). The barrier layer 12 has the function of insulating underneath the cathode region 8 in such a way that it is electrically insulated from the P-well region 4, and has a thickness between 10 nm and 700 nm, chosen according to the material used (e.g., high-k materials generally require a smaller thickness than do low-k materials) and to the corresponding possibility of implementing formation of the barrier layer in an industrial process.

The device 1 of FIG. 1 further comprises a top contact metallization 18, which is in electrical contact with the cathode region 8 and is electrically insulated from the porous regions 10 by insulating regions 19, and a bottom contact metallization 20, which is in electrical contact with the back of the substrate 2, on the bottom surface 2b, which forms the anode of the light-emitting device 1. In use, a voltage is applied between the top contact metallization 18 and the bottom contact metallization 20 for generating a difference of potential along Z such as to cause passage of the charge carriers through the porous regions 10. The presence of the barrier layer 12 forces the passage of the electric current along paths lateral with respect to the cathode region 8 and inside the porous region 10. As illustrated in FIG. 1, by forming the barrier layer 12 underneath the cathode region 8, the only path allowed for the current is the one represented schematically by the diodes 16. In this way, the path of the current through the porous region 10 is maximized, at the same time maximizing emission of photons through the porous region 10. The presence of the bulk region 6 and of the P-well region 4, with different doping concentrations, enables a final substrate to be obtained with low resistivity in the region where conduction of the electrical charges occurs, as well as a reduction of the costs (as substrates of this type are available on the market at reduced costs).

However, according to a different embodiment, the substrate 2 may be uniformly doped and, thus, not present are the two distinct regions, the P-well region 4 and the bulk region 6. In other words, according to this embodiment, the substrate 2 has a uniform doping profile along Z, in particular with a concentration of dopant species of a P type between $10^{14}$ and $10^{17}$ atoms/cm$^3$, for example $10^{15}$ atoms/cm$^3$.

With reference to FIGS. 2-6, a method for manufacturing a light-emitting device (LED) is now described, according to one embodiment. FIGS. 2-6 show lateral cross-sectional views of a wafer 100 during successive manufacturing steps. The wafer 100 is machined to obtain a plurality of portions 1 of the light-emitting device of the type illustrated in FIG. 1, arranged alongside one another.

The views of FIGS. 2-6 are taken along the plane XZ of the cartesian system X, Y, Z. First of all, (FIG. 2) a wafer 100 of semiconductor material with a doping of a P type is provided. The wafer 100 comprises, in particular, the substrate 2 of monocrystalline silicon. The term "substrate" 2 refers, in this context, also to possible layers of semiconductor material grown epitaxially on the wafer boo. In particular, the substrate 2 comprises the P-well region 4 that extends over the bulk region 6. The P-well region 4 is, according to one embodiment, grown epitaxially on the bulk region 6. Both the P-well region 4 and the bulk region 6 are monocrystalline. Wafers 100 of the type described are available on the market and may be purchased in the form of the embodiment illustrated in FIG. 2.

Then (FIG. 3) a plurality of implanted regions is formed, which constitute, after an annealing step, the cathode regions 8. The cathode regions 8 extend in depth into the P-well region 4, starting from the top surface 2a of the wafer 100, and have a thickness, along Z, between 0.1 µm and 0.5 µm, for example 0.3 µm. However, it may be evident that cathode regions 8 with larger thicknesses may be obtained (e.g., cathode regions that extend to a depth of some microns, for example 1-3 µm). The cathode regions 8 further extend at a distance from one another, along the axis X. In this way, a respective portion of the P-well region 4 extends between the cathode regions 8.

Next (FIG. 4), one or more porous-silicon regions (referred to in what follows as "porous regions") 10 are formed, which laterally surround the cathode regions 8. As may be noted from FIG. 4, formation of the porous silicon proceeds also partially underneath the cathode regions 8.

According to a different embodiment (not illustrated) it is possible to form the porous silicon altogether underneath the cathode regions 8, thus forming a single porous-silicon region that surround completely (laterally and underneath) the cathode regions 8. In this connection, see, for example, G. Barillaro et al., in "Integrated porous-silicon light-emitting diodes: A fabrication process using graded doping profiles", Applied Physics Letters, Vol. 78, N. 26, Jun. 25, 2001.

The porous regions 10 are formed in a per se known manner, for example, by dipping the wafer 100 into an electrolytic solution in a galvanic cell and subjecting it to a step of electrochemical etching in hydrofluoric acid (HF), as described for example in the paper "Epi-micromachining", P. J. French, P. T. J. Gennissen, P. M. Sarro, Microelectronics Journal 28 (1997), p. 459. As discussed in this article, a selective etching of the heavily doped regions (here the portions of the P-well region 4 exposed on the top surface 2a) is obtained, with formation of porosities. Consequently, the material of the P-well region 4 is converted from monocrystalline silicon into porous silicon, to form the porous regions 10.

The above-mentioned method is also known as "anodic electrochemical etching." As is known, the anodization process acts only in the presence of holes, and thus formation of the porous regions 10 occurs only in the P-well region 4. Formation of the porous silicon by anodic electrochemical etching is conducted using the following parameters: etching current density between 1 and 500 mA/cm$^2$ (typically, 50 mA/cm$^2$); etching time between 1 and 3000 seconds (typically 10 s); and HF concentration between 1% and 48% (typically, 25%). These parameters enable a porous-silicon region to be obtained having a thickness in the range 0.1-10 µm with a porosity between 10% and 90%. According to one embodiment, the porous regions 10 each have a thickness, along Z, of 0.5 µm and a porosity of 70%.

In any case, it is expedient for each porous region 10 to extend in depth in the direction Z, along each respective cathode region 8, throughout the thickness of the respective cathode regions 8 that it faces. In other words, the sides (parallel to the plane YZ) of the cathode regions 8 border on respective porous regions 10.

Then (FIG. 5), a step of implantation of oxygen atoms is carried out using the same implantation mask as the one used previously for formation of the cathode regions 8. Alternatively, it is possible to use a mask similar to the one used previously for formation of the cathode regions 8, but with apertures of a larger dimensions along X and Y. Ion implantation of oxygen has the function of forming a plurality of barrier layers 12, each of which extends underneath a respective cathode region 8 and, in particular, at the interface between each cathode region 8 and the P-well region 4. Each barrier layer 12 extends completely underneath the cathode regions 8, both along the axis X and along the axis Y.

The barrier layers 12 are formed by ion implantation of oxygen, with an implantation dosage between $5 \cdot 10^{15}$ and $10^{18}$, typically $5 \cdot 10^{17}$, and an implantation energy chosen according to the depth at which the interface between the barrier layer 12 and the P-well region 4 is located. For instance, if the barrier layer 12 reaches a maximum depth, measured from the top surface 2a, of 0.2 µm, the implantation energy is chosen equal to 80 keV for forming the respective barrier layer 12 at a depth of approximately 0.15 µm from the top surface 2a (thus creating a barrier 50-nm thick starting from a depth of 150 nm).

The implantation step is followed by an annealing step, at a temperature between 900° C. and 1300° C., typically 1100° C., for a time between 20 minutes and 5 hours, typically 3 hours. This annealing step is carried out in an inert atmosphere, for example nitrogen, to prevent formation of oxide (in the embodiment considered, silicon oxide) at the top surface 2a and the bottom surface 2b of the wafer 100. This step has the function of favoring formation of silicon oxide in the regions subjected to oxygen implantation, thus leading to complete formation of the barrier layers 12.

This (FIG. 6) is followed by steps, in themselves known, of formation of the top and bottom contact metallizations 18, 20, which form, respectively, the cathode contact and the anode contact. Formation of the top contact metallization 18 is preceded by a step of formation of insulating regions 19 to insulate electrically each top contact metallization 18 from surface portions of the P-well region 4, but not from the respective cathode region 8. According to an alternative embodiment, the step of formation of the porous regions 10 is carried out following upon the oxygen-implantation step for formation of the dielectric regions 12.

In addition, according to a further embodiment and in a way not illustrated in the figures, the bottom contact metallization 20 is not formed, and the corresponding anode contact is formed at the front of the wafer 100 through a trench that extends along the thickness (axis Z) of the wafer 100 and is designed to be arranged in electrical contact with the bulk region 6 with the front (top surface 2a) of the wafer 100. In this way, both of the anode and cathode contacts are accessible from the front of the wafer 100.

With reference to FIGS. 7-12, steps of a process for manufacturing a light-emitting device are described according to a further embodiment, alternative to that of FIGS. 3-6. FIGS. 7-12 are views in lateral section, taken along the plane XZ of the cartesian system X, Y, Z.

Figure 2:
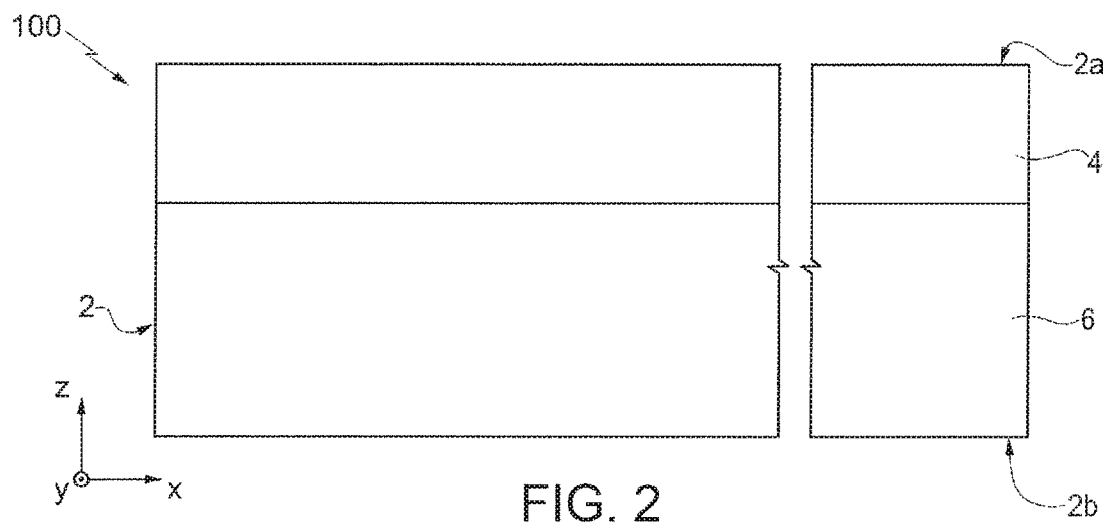
FIGS. 2-6 are schematic cross-sectional views illustrating manufacturing steps of a light-emitting device according to an embodiment.
Figure 3:
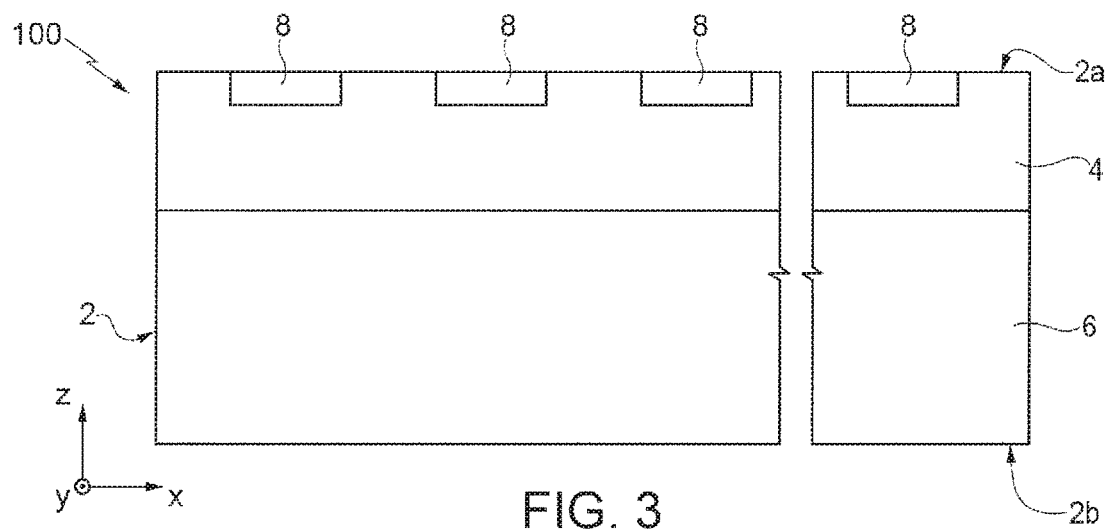
Figure 4:
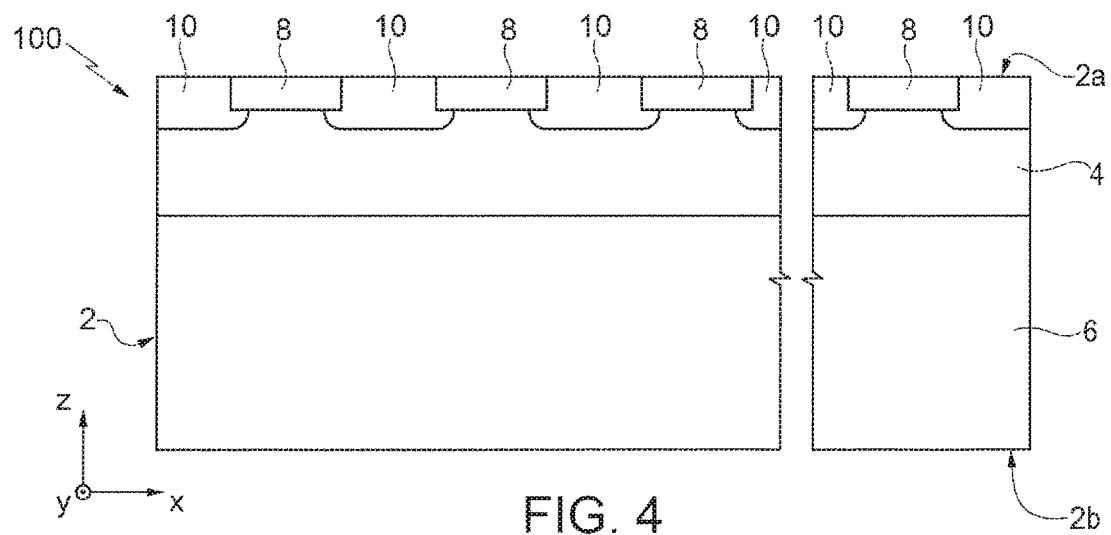
Figure 5:
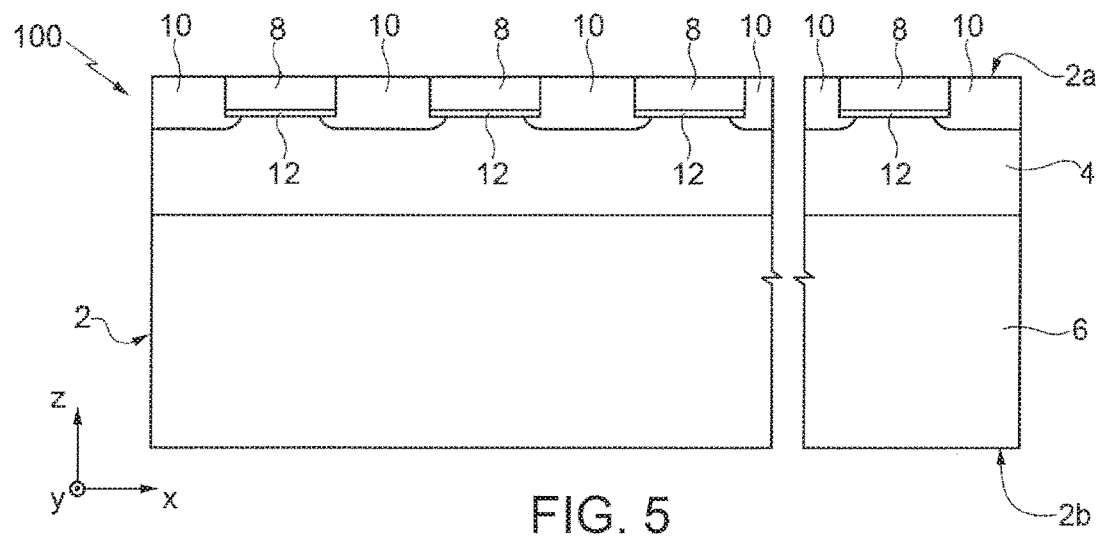
Figure 7:
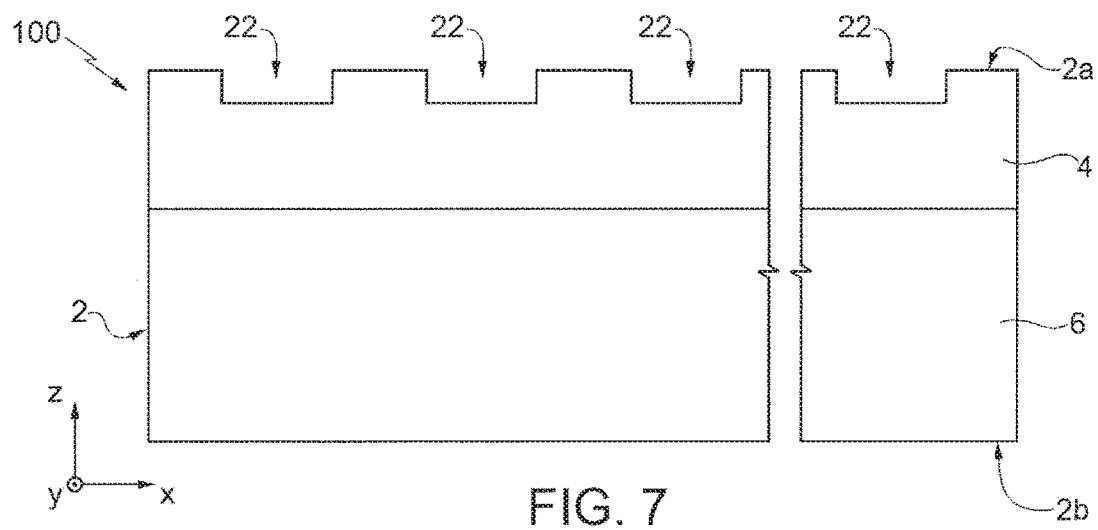
FIGS. 7, 8A-8B, 9-12 are schematic cross-sectional views illustrating manufacturing steps of a light-emitting device according to another embodiment.

After the wafer 100 of FIG. 2 has been provided, the next step, as illustrated in FIG. 7, is formation of trenches 22 in surface portions of the wafer 100, where, in subsequent steps, the cathode regions 8 are to be formed. This step includes carrying out etching on the top surface 2a of the substrate 2 to form, in the P-well region 4, trenches 22 that have a depth between 0.1 µm and 0.5 µm.

Then (FIG. 8A), a step of thermal oxidation of the wafer 100 is carried out to enable growth of an oxide layer 24 (in this embodiment, silicon oxide) on the surface 2a of the substrate 2 and on the surface of the P-well region 4 exposed through the trenches 22. In particular, the oxide layer grows both at side walls 22a and at a bottom 22b of each trench 22. The oxide layer 24 has a substantially uniform thickness over the entire wafer 100, for example between 10 nm and 500 nm, in particular 100 nm. The oxide layer 24 then forms, in subsequent manufacturing steps, the barrier layer 12.

According to an alternative embodiment (illustrated in FIG. 8B), it is possible to form the barrier layer 12 as a multilayer, with improved insulating properties, and in particular with an electrical impedance higher than that of a single insulating layer. In this case, it is possible, following upon or as an alternative to formation of the insulating layer 24, to deposit an insulating nitride-oxide layer 26 having a thickness between 10 nm and 300 nm (e.g., 50 nm), and this is followed by a further deposition of silicon oxide to form a further insulating layer 28 with a thickness between 10 nm and 400 nm (e.g., 100 nm). The insulating layers 24, 26 and 28 may all three be present, or else just two, for example the insulating layer 24 and the insulating layer 26, or else the insulating layer 26 and the insulating layer 28. Furthermore, the materials indicated for the insulating layers 26 and 28 are provided by way of example of possible embodiments. Other materials include: alumina $Al_2O_3$ or in general high-k materials (tantalum oxides $Ta_2O_5$, titanium oxides $TiO_2$, $SrTiO_3$, oxynitrides $SiO_xN_y$, etc.), and low-k materials (porous silicon oxide, C-doped or F-doped silicon oxide, etc.). The thicknesses of the insulating layers 24, 26 and 28 are chosen in such a way that the resulting multilayer has a total thickness between 10 nm and 700 nm.

Figure 8A:
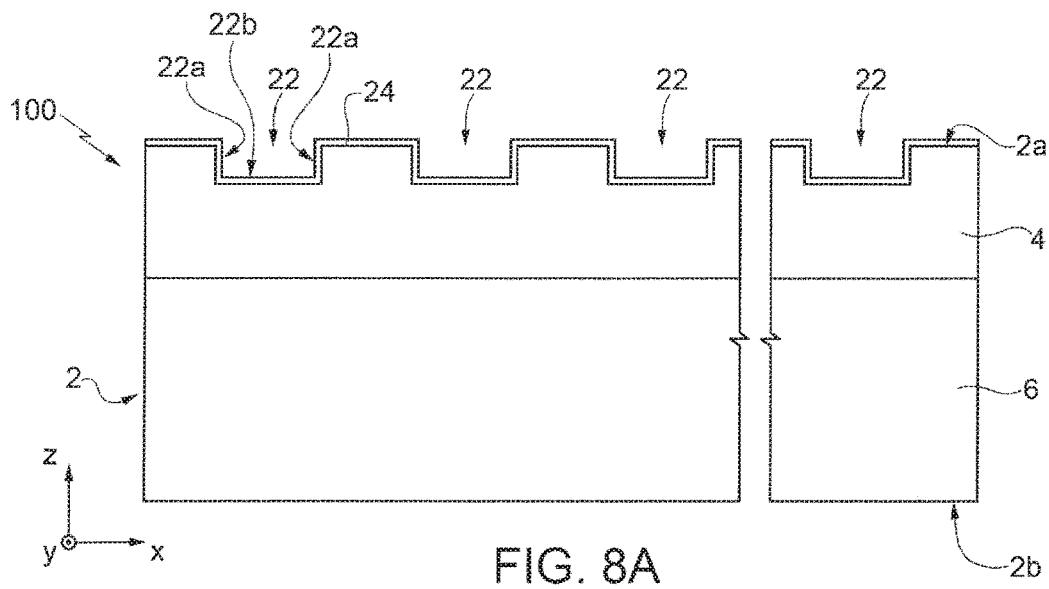
Figure 8B:
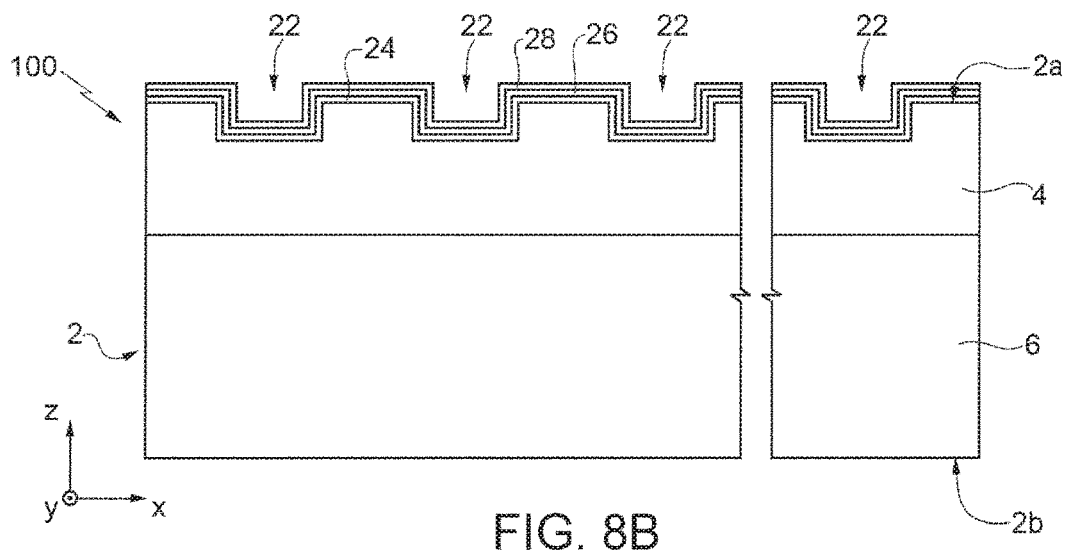
Figure 9:
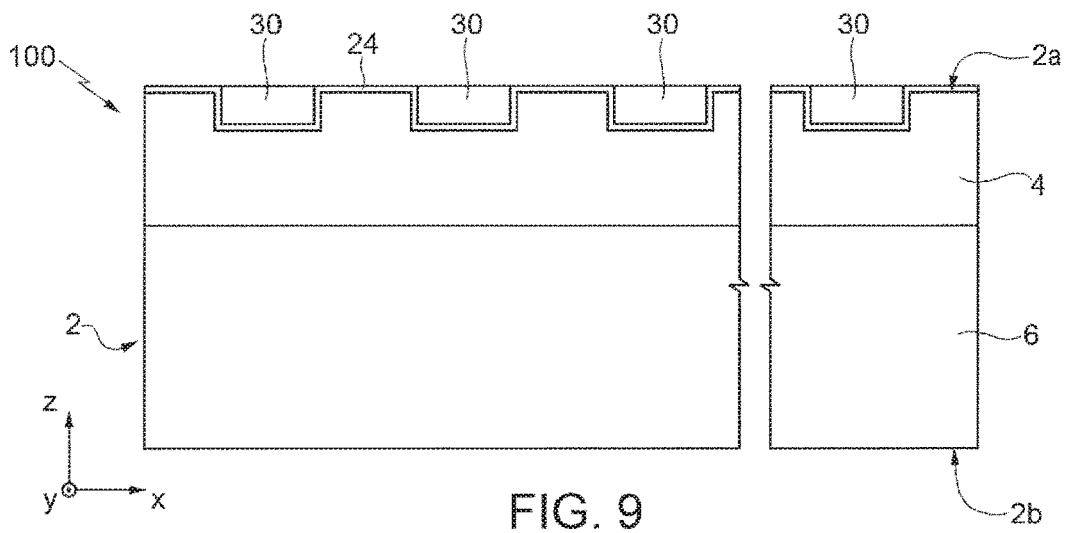
Figure 10:
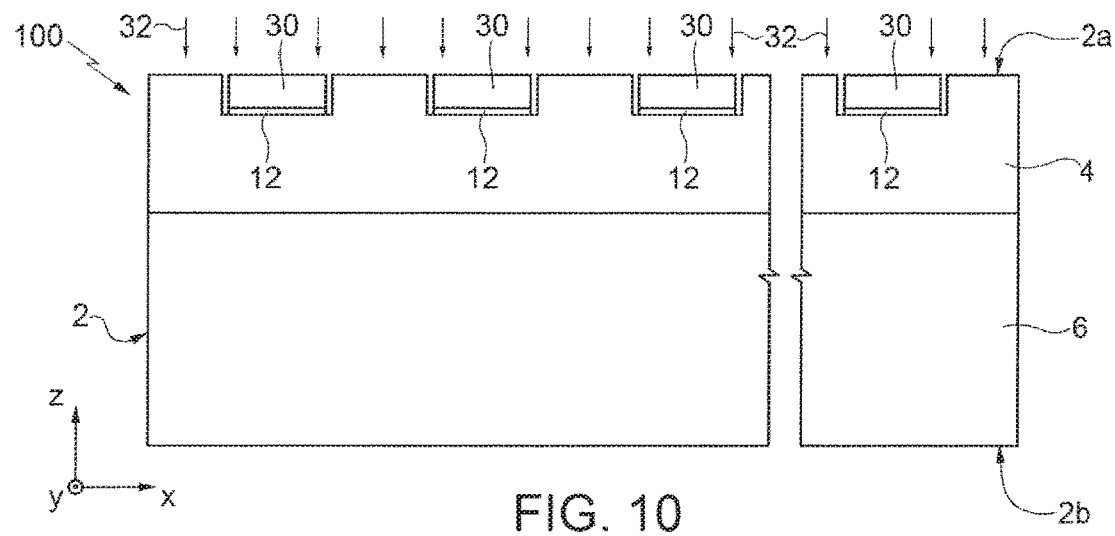
Figure 11:
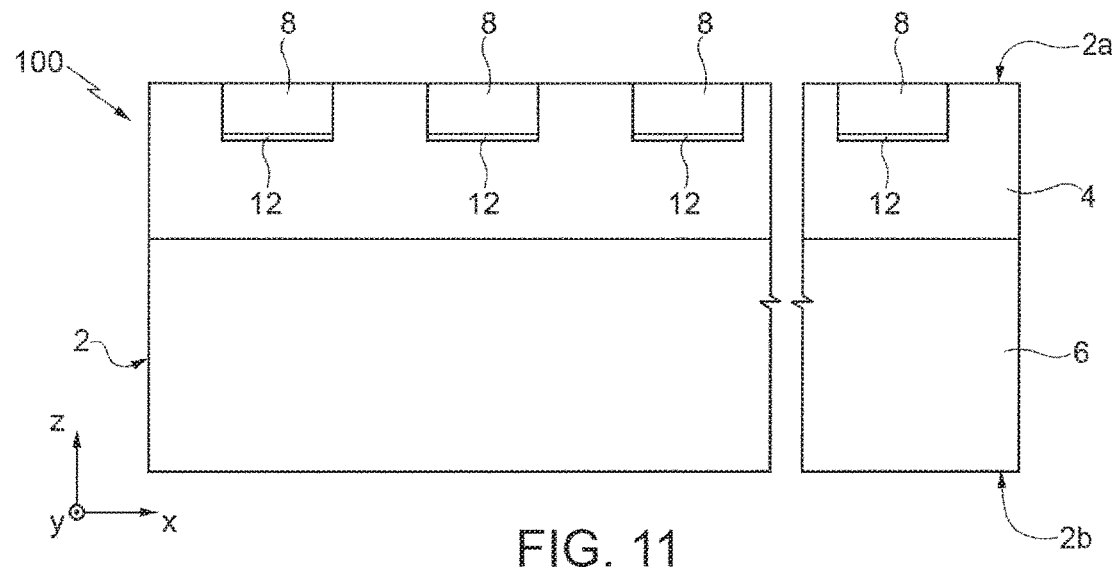
Figure 12:
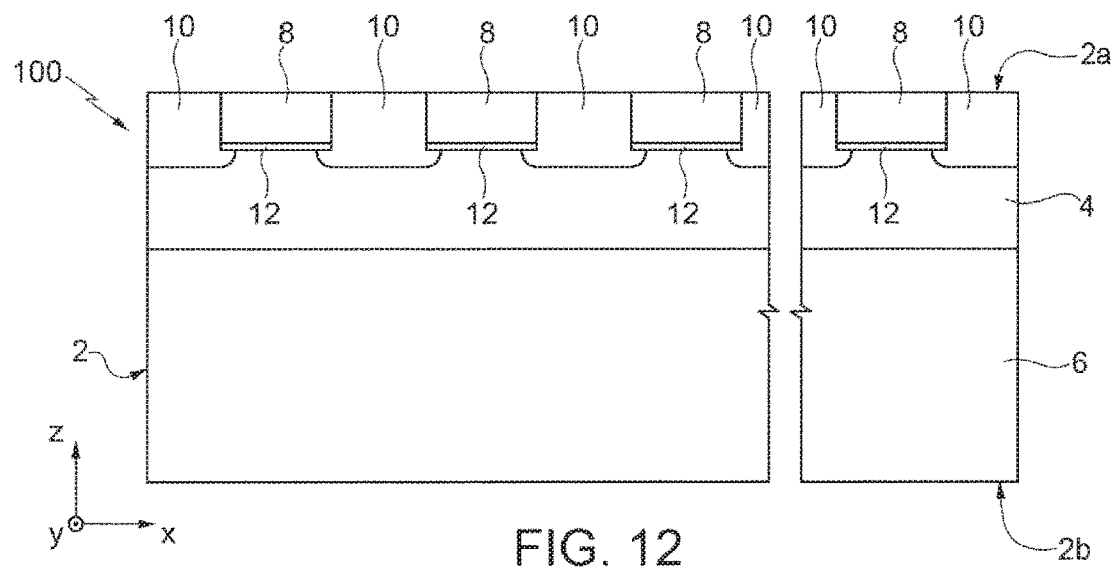

After the step of FIG. 8A, or FIG. 8B, the step of FIG. 9 is carried out (in this case, FIG. 9 shows just the insulating layer 24), with deposition of polysilicon with an N+ doping on the wafer 100, in such a way as to form filling regions 30 in the trenches 22. A subsequent CMP planarization step enables elimination of the polysilicon from the surface portions of the wafer 100 outside the trenches 22. The step of doping of the polysilicon regions formed in the trenches 22 may be carried out also following upon deposition, using an appropriate implantation mask.

Then (FIG. 10), the oxide layer 24 is removed from the surface 2a of the wafer 100 and from the side walls 22a of the trenches 22. This step is carried out in a per se known manner, by wet etching or dry etching, as represented schematically by the arrows 32. The portions of the insulating layer 24 that extend between the filling regions 30 and the bottom 22b of the trenches 22 are not removed in so far as they are protected by the filling regions 30 themselves. The dielectric regions 12 are thus formed.

A subsequent step of epitaxial growth (FIG. 1i) is carried out until the spaces that have formed alongside the filling regions 30 on account of removal of the insulating layer 24 are filled, thus forming the cathode contacts. This is followed by formation (FIG. 12) of the porous regions 10. The step of formation of the porous silicon is carried out following the method described previously with reference to FIG. 4 and thus not described any further here.

Figure 6:
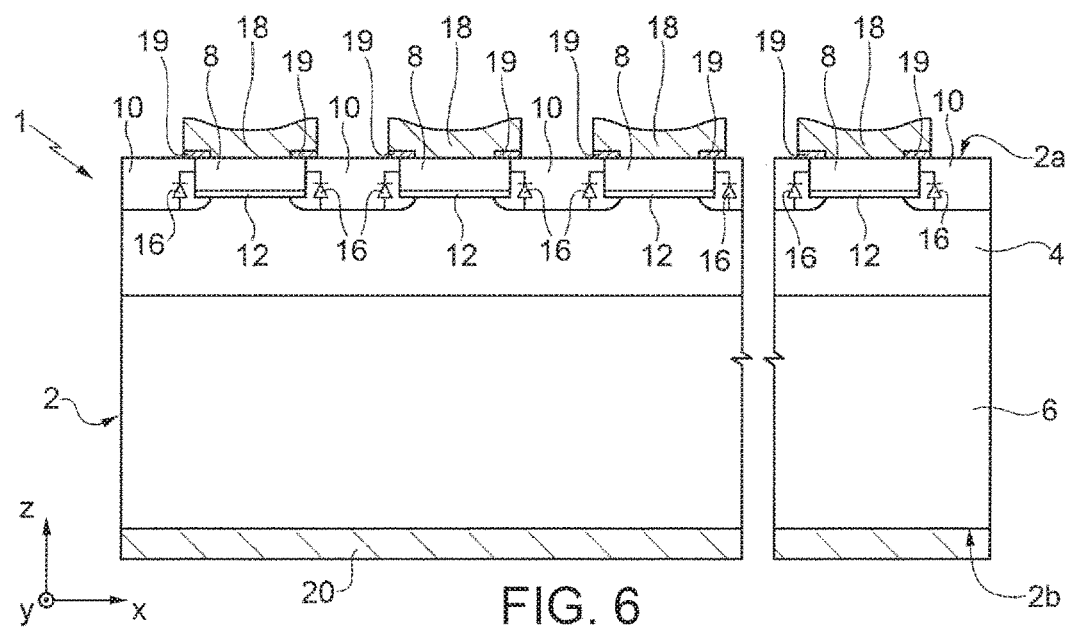

This is followed by formation of the top contact metallization 18 and bottom contact metallization 20, as has already been described with reference to FIG. 6 and illustrated in this figure. As described previously, in a way not illustrated in the figures, the bottom contact metallization 20 may not be formed and, in this case, the corresponding anode contact is provided at the front of the wafer 100 through a trench formed along the thickness (axis Z) of the wafer 100. In this way, both of the anode and cathode contacts are accessible from the front of the wafer 100.

With reference to FIGS. 13-17 there now follows a description of steps of a further process for manufacture of a light-emitting device of the type illustrated in FIG. 1, according to a respective embodiment alternative to that of FIGS. 3-5 and 7-12. FIGS. 13-17 are views in lateral section, taken along the plane XZ of the cartesian system X, Y, Z.

Figure 13:
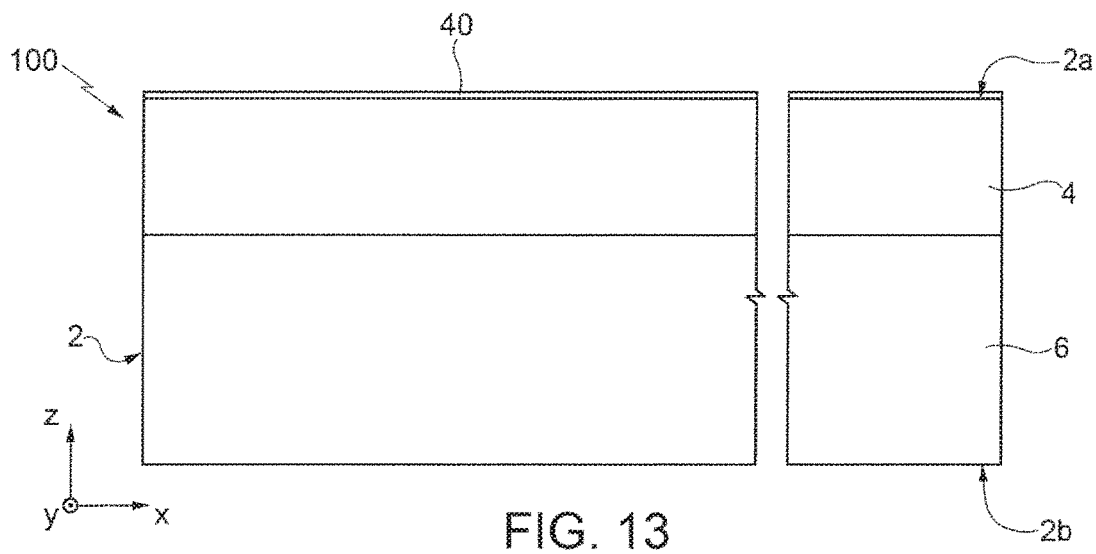
FIGS. 13-17 are schematic cross-sectional views illustrating manufacturing steps of a light-emitting device according to yet another embodiment.
Figure 14:
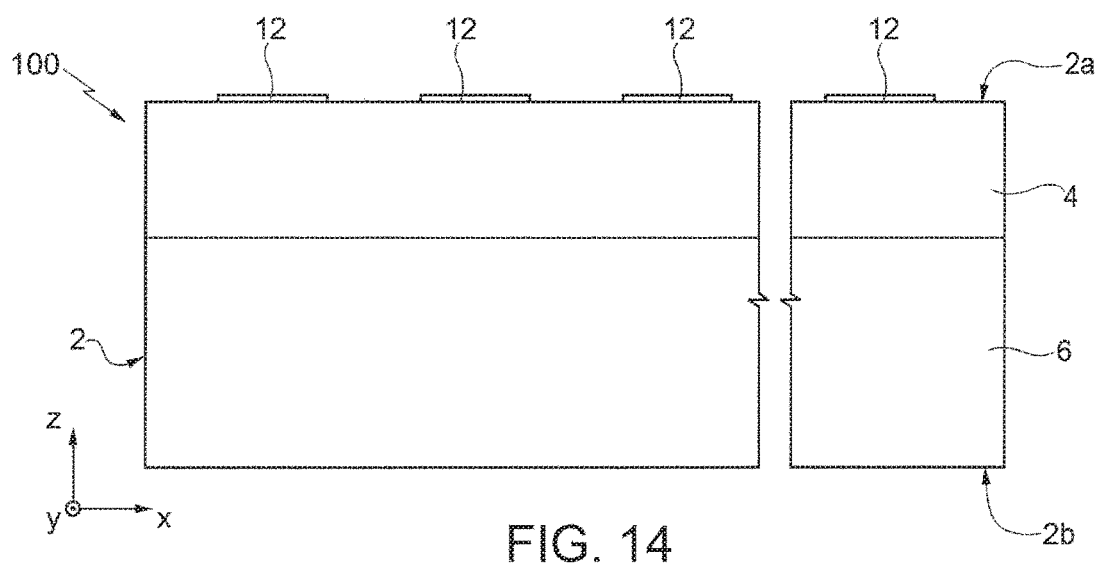
Figure 15:
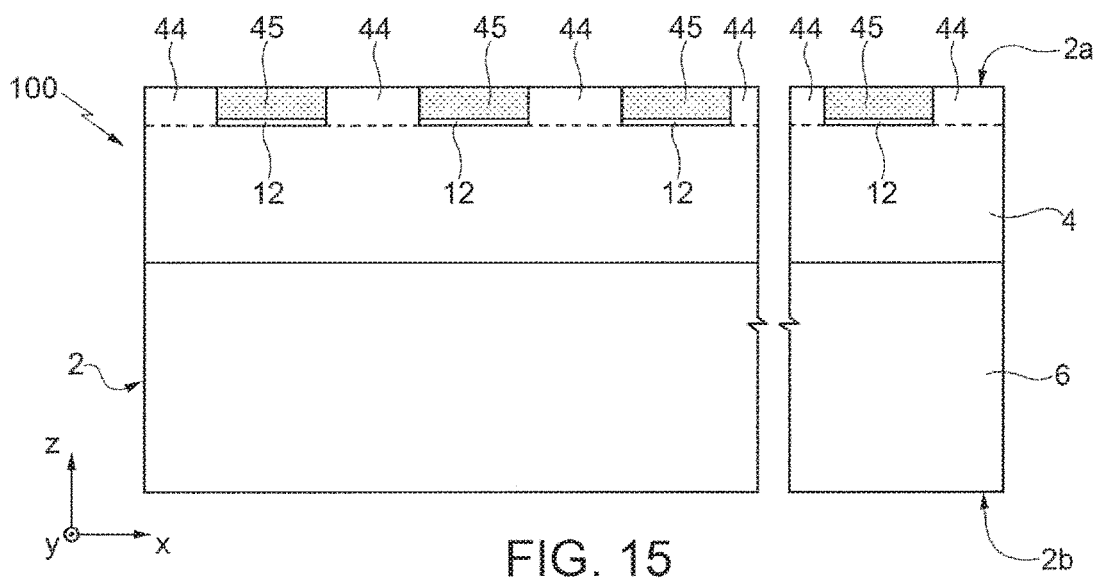
Figure 16:
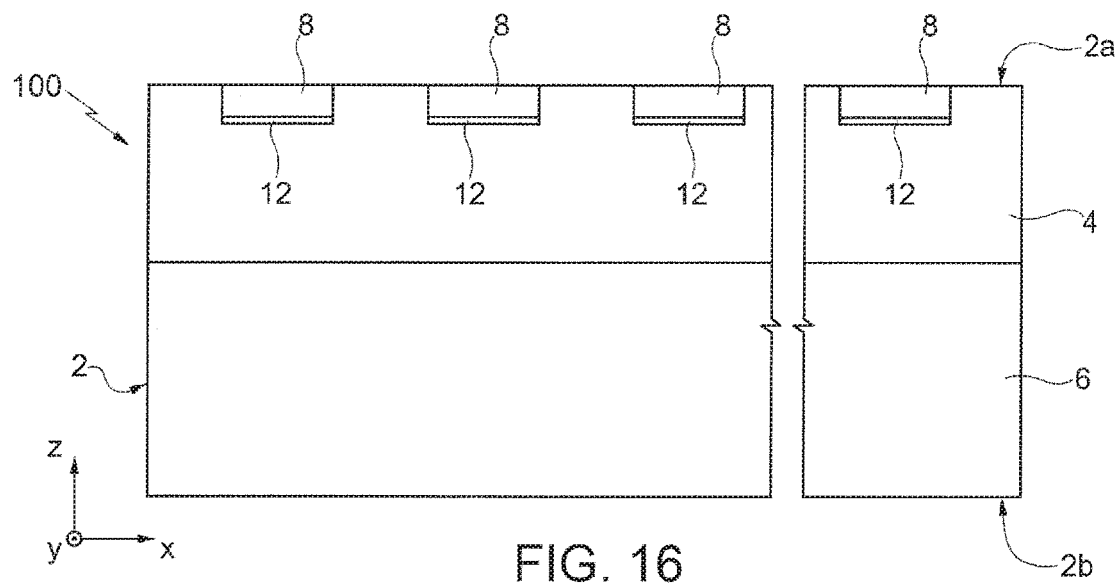
Figure 17:
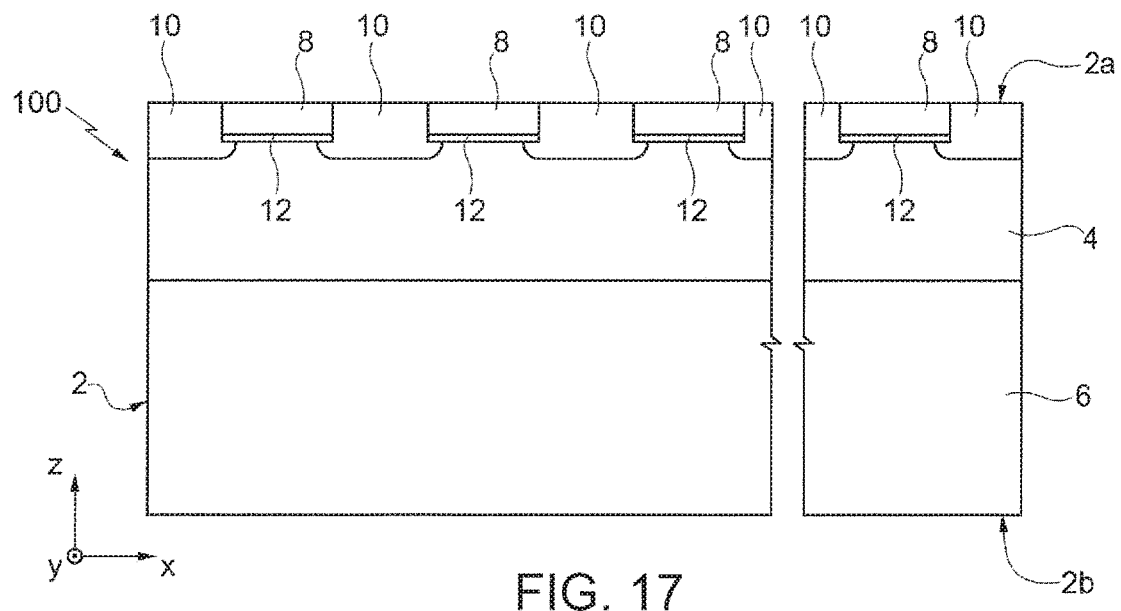

After the wafer 100 of FIG. 2 has been provided, the next step (as illustrated in FIG. 13) is formation of an insulating layer 40 by thermal growth of silicon oxide or formation of an insulating material, such as for example silicon oxide, silicon nitride, alumina $Al_2O_3$ or in general high-k materials (tantalum oxides $Ta_2O_5$, titanium oxides $TiO_2$, $SrTiO_3$, oxynitrides $SiO_xN_y$, etc.), and low-k materials (porous silicon oxide, C-doped or F-doped silicon oxide, etc.). Alternatively, in a way not illustrated in the figure, the insulating layer 40 may be replaced by a multilayer including a plurality of layers arranged on top of one another of silicon oxide, silicon nitride, alumina $Al_2O_3$ or in general high-k materials (tantalum oxides $Ta_2O_5$, titanium oxides $TiO_2$, $SrTiO_3$, oxynitrides $SiO_xN_y$, etc.), and low-k materials (porous silicon oxide, C-doped or F-doped silicon oxide, etc.), in any combination thereof and as described with reference to FIG. 8B.

This is then followed (FIG. 14) by a step of etching of selective portions of the insulating layer 40 (or of the multilayer, according to the respective embodiment) to form a plurality of barrier layers 12. A plurality of barrier layers 12 is thus formed alternating with surface portions of the P-well region 4.

Next (FIG. 15), a step of epitaxial growth is carried out on the front side of the wafer 100 to form monocrystalline-silicon regions 44 on the exposed portions of the P-well region 4 (which is also monocrystalline), alternating with polycrystalline-silicon regions 45 on the barrier layers 12. The epitaxial growth is carried out in such a way that the monocrystalline-silicon regions 44 and the polycrystalline-silicon regions 45 thus formed and has a thickness, along Z, between 0.1 µm and 0.5 µm, for example 0.3 µm. It may be evident that, according to the desire, the polycrystalline-silicon regions 45 may have a thickness greater than the one indicated, for example a thickness of a few microns.

According to one embodiment, the regions 44 and 45 grown epitaxially have a doping of a P type, with a concentration of dopants similar to the concentration of dopants of the P-well region 4. A step of planarization of the front of the wafer 100 may then optionally be carried out.

Next (FIG. 16), an implantation of dopant species of a N type (e.g., arsenic) is carried out for obtaining a doping of an N+ type (using an appropriate mask) of just the monocrystalline-silicon regions 44 to form the cathode regions 8. This is then followed by formation of the porous regions 10 (FIG. 17) according to the steps of formation of porous silicon described previously with reference to FIG. 4 and not described any further here.

Finally, the top contact metallizations 18 and bottom contact metallizations 20 are formed, as has already been described with reference to FIG. 6 and illustrated in this figure. As described previously, in a way not illustrated in the figures, the bottom contact metallization 20 may not be formed, and, in this case, the corresponding anode contact is provided at the front of the wafer 100 through a trench formed along the thickness (axis Z) of the wafer 100. In this way, both of the anode and cathode contacts are accessible from the front of the wafer 100.

According to a different embodiment, the regions 44 and 45 grown epitaxially have a doping of an N+ type (with a dopant concentration required for the cathode regions 8). In this case, the step of FIG. 16 envisages implantation of dopant species of a P type (e.g., boron) in just the monocrystalline-silicon regions 44 for creating an environment suited for subsequent formation of porous silicon (e.g., concentration of dopants of a P type between $10^{14}$ and $10^{17}$ atoms/cm$^3$).

The advantages that may be obtained with the embodiments described emerge clearly from the foregoing description. In particular, based upon the arrangement of the barrier layer 12, the path of the electric current is forced through the lateral portions of the cathode region 8 so that all the current generated flows through the porous silicon 10, generating light emission. Furthermore, since the flow of electric current occurs laterally with respect to the cathode region 8, there may be little or no shielding effect by the cathode 8 itself, as would occur if, in the absence of the barrier layer 12, the current were to flow also through porous-silicon portions 10 formed underneath the cathode region 8.

Finally, it is clear that numerous modifications and variations may be made to what has been described and illustrated herein, all of which fall within the sphere of protection and scope of the inventive idea, as defined in the annexed claims. For instance, for all the embodiments described, formation of the porous silicon to obtain the porous regions 10 may be carried out by additive synthesis of porous silicon through chemical and/or electrochemical deposition of silicon or synthesis of a film of silicon nanoclusters in a per se known manner, for example as described in M. Thakur, S. L. Sinsabaugh, M. J. Isaacson, M. S. Wong, S. L. Biswal, SCIENTIFIC REPORTS, 2, 795 (2012).

Alternatively, it is also possible to use RIE, which leads to formation of porous silicon, as described in various publications, such as Li, X., Curr. Opin. Solid State Mater. Sci. 2012, 16, 71-81 (PS by metal-etching); Kurt W. Kulasinski, "Porous Silicon Formation by Stain Etching", Springer International Publishing, Switzerland 2014, L. Canham (ed.), Handbook of Porous Silicon (PS by stain-etching); S. B. Jo, M. W. Lee, S. G. Lee, E. H. Lee, S. G. Park, B. H. O, J. Vac. Sci. Technol. A, 23, 905 (2005) (PS via RIE, micrograss).

What is claimed is:

1. A method for manufacturing a light-emitting device comprising:
    forming a cathode region adjacent a semiconductor body having a front side and a back side, the semiconductor body having a first conductivity type and the cathode region having a second conductivity type;
    forming a porous-silicon region coupled to lateral portions of the cathode region, the lateral portions extending between a top side, facing the front side, and a bottom side, opposite to the top side of the cathode region; and
    forming a barrier region of electrically insulating material coupled to the bottom side of the cathode region.

2. The method according to claim 1 wherein forming the barrier region comprises forming a monolayer of silicon oxide, silicon nitride, alumina, silicon oxynitride, tantalum oxide, titanium oxide, strontium titanium oxide, porous silicon oxide, carbon doped silicon oxide, or fluorine based silicon oxide.

3. The method according to claim 1 wherein the semiconductor body comprises silicon, and forming the barrier region comprises:
    performing an ion implantation of oxygen atoms to form an implanted region at the bottom side of the cathode region; and
    annealing to generate a layer of silicon oxide in the implanted region.

4. The method according to claim 1 wherein forming the barrier region comprises forming a multilayer barrier region in a stacked arrangement and comprising silicon oxide, silicon nitride, alumina, silicon oxynitride, tantalum oxide, titanium oxide, strontium titanium oxide, porous silicon oxide, carbon doped silicon oxide, or fluorine based silicon oxide.

5. The method according to claim 1 wherein the semiconductor body comprises monocrystalline silicon;
    wherein forming the barrier region comprises depositing a silicon-oxide layer on the semiconductor body to form a silicon-oxide island surrounded by surface portions of the semiconductor body;
    wherein forming the cathode region comprises epitaxially growing polycrystalline-silicon regions on the silicon-oxide island; and
    wherein forming the porous-silicon region comprises epitaxially growing monocrystalline-silicon regions on the surface portions.

6. The method according to claim 1 wherein forming the barrier region comprises:
    etching a selective portion of the semiconductor body to form a trench; and
    forming a layer of electrically insulating material on the bottom of the trench, wherein forming the cathode region comprises filling the trench with material having the second conductivity type, and wherein forming the porous-silicon region comprises forming porous silicon in the portions of semiconductor body that surround the trench laterally.

7. The method according to claim 1 wherein the barrier region has a thickness between 10 nm and 700 nm.

8. The method according to claim 1 further comprising:
    providing a bulk region having the first conductivity and a first doping value; and
    forming a well region between the bulk region and the front side, the well region having the first conductivity and a second doping value different from the first doping value.

9. The method according to claim 8 wherein the cathode region is electrically coupled to the well region only through the porous-silicon region.

10. The method according to claim 8 wherein the well region has P type dopants with a doping concentration between $10^{14}$ atoms/cm$^3$ and $10^{17}$ atoms/cm$^3$, and the bulk region has a doping concentration between $10^{16}$ atoms/cm$^3$ and $10^{20}$ atoms/cm$^3$.

11. The method according to claim 1 wherein forming the porous-silicon region comprises performing anodic electrochemical etching.

12. The method according to claim 11, wherein performing the anodic electrochemical etching comprises using an etching current density between 1 and 500 mA/cm$^2$, an etching time between 1 s and 3000 s, and using hydrofluoric acid at a concentration between 1% and 48%.

13. A method for manufacturing a light-emitting device comprising:
    forming a well region having a first doping type in a semiconductor substrate;

forming a cathode region in the well region, the cathode region having a second doping type opposite to the first doping type;

forming a porous-silicon region having the first doping type by converting a portion of the well region;

using an implantation and anneal process, forming a barrier region between the porous-silicon region and the well region;

forming a first contact for contacting the cathode region; and forming a second contact for contacting the well region.

14. The method according to claim 13 wherein the semiconductor substrate comprises silicon, and wherein using the implantation and anneal process comprises:

performing an ion implantation of oxygen atoms to form implanted regions at a bottom side of the cathode region; and annealing to convert the implanted regions into silicon oxide regions.

15. The method according to claim 13 wherein forming the porous-silicon region comprises:

forming a region of porous-silicon between the cathode region and the well region.

16. The method according to claim 13 wherein porous-silicon region forms a continuous porous-silicon region that surrounds all sidewalls of the cathode region and a bottom side of the cathode region.

17. The method according to claim 13 wherein forming the porous-silicon region comprises performing anodic electrochemical etching.

18. The method according to claim 17, wherein performing the anodic electrochemical etching comprises using an etching current density between 1 and 500 mA/cm$^2$, an etching time between 1 s and 3000 s, and using hydrofluoric acid at a concentration between 1% and 48%.

19. A method for manufacturing a light-emitting device comprising:

forming a well region having a first doping type in a semiconductor substrate;

forming a plurality of trenches in the well region;

depositing a first insulating layer over the well region, the first insulating layer covering bottom surfaces and sidewalls of the plurality of trenches;

filling the plurality of trenches to form a plurality of cathode regions having a second doping type, the second doping type being opposite to the first doping type;

removing portions of the first insulating layer covering the sidewalls of the plurality of trenches;

using an epitaxial process, growing the well region to fill a space left by one of the removed portion of the first insulating layer with an epitaxial region having the first doping type; and forming a porous-silicon region having the first doping type by converting the epitaxial region and the well region.

20. The method of claim 19, further comprising removing the first insulating layer from over the well region.

21. The method according to claim 19 wherein forming the first insulating layer comprises forming a layer of silicon oxide, silicon nitride, alumina, silicon oxynitride, tantalum oxide, titanium oxide, strontium titanium oxide, porous silicon oxide, carbon doped silicon oxide, or fluorine based silicon oxide.

22. The method according to claim 19 further comprising forming a second insulating layer over the first insulating layer.

23. The method according to claim 19 wherein filling the plurality of trenches comprises depositing heavily doped polysilicon of the second doping type.

24. The method according to claim 19 wherein forming the porous-silicon region comprises performing anodic electrochemical etching.

25. The method according to claim 24, wherein performing the anodic electrochemical etching comprises using an etching current density between 1 and 500 mA/cm$^2$, an etching time between 1 s and 3000 s, and using hydrofluoric acid at a concentration between 1% and 48%.

26. A method for manufacturing a light-emitting device comprising:

forming a well region having a first doping type in a semiconductor substrate;

forming a plurality of cathode regions in the well region, the cathode region having a second doping type opposite to the first doping type, adjacent ones of the plurality of cathode regions being separated by portions of the well region;

exposing the semiconductor substrate to hydrofluoric acid to selective convert the portions of the well region to a plurality of porous-silicon regions having the first doping type;

using a first implantation mask, implanting oxygen through the plurality of cathode regions to form a plurality of barrier regions, each of the plurality of cathode regions being separated from the well region by one of the plurality of barrier regions;

forming a first contact for contacting the plurality of cathode regions; and forming a second contact for contacting the well region.

27. The method of claim 26, wherein forming the plurality of cathode regions comprises implanting a dopant of the second doping through a second implantation mask.

28. The method of claim 27, wherein the first implantation mask and the second implantation mask are the same mask.

* * * * *

UNITED STATES PATENT AND TRADEMARK OFFICE
CERTIFICATE OF CORRECTION

PATENT NO. : 10,825,954 B2
APPLICATION NO. : 15/983959
DATED : November 3, 2020
INVENTOR(S) : Marco Morelli Page 1 of 1

It is certified that error appears in the above-identified patent and that said Letters Patent is hereby corrected as shown below:

On the Title Page

In Item (73), delete "Bianza" and insert --Brianza--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*